United States Patent
Yamazaki et al.

(10) Patent No.: US 8,878,574 B2
(45) Date of Patent: Nov. 4, 2014

(54) METHOD FOR DRIVING SEMICONDUCTOR DEVICE

(71) Applicant: Semiconductor Energy Laboratory Co., Ltd., Atsugi (JP)

(72) Inventors: Shunpei Yamazaki, Tokyo (JP); Jun Koyama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/961,048

(22) Filed: Aug. 7, 2013

(65) Prior Publication Data

US 2014/0043068 A1 Feb. 13, 2014

(30) Foreign Application Priority Data

Aug. 10, 2012 (JP) ................................ 2012-177881

(51) Int. Cl.
| | |
|---|---|
| *H03K 3/00* | (2006.01) |
| *H03K 3/012* | (2006.01) |
| *H03K 19/00* | (2006.01) |
| *G09G 3/00* | (2006.01) |

(52) U.S. Cl.
CPC ............. *H03K 3/012* (2013.01); *H03K 19/00* (2013.01); *G09G 3/00* (2013.01)
USPC ........................................................ 327/109

(58) Field of Classification Search
USPC ........................................................ 327/109
See application file for complete search history.

(56) References Cited

U.S. PATENT DOCUMENTS

| | | | |
|---|---|---|---|
| 5,274,601 A | * | 12/1993 | Kawahara et al. ....... 365/230.06 |
| 5,731,856 A | | 3/1998 | Kim et al. |
| 5,744,864 A | | 4/1998 | Cillessen et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Daniel Rojas
(74) *Attorney, Agent, or Firm* — Fish & Richardson P.C.

(57) ABSTRACT

To provide a driving method of a semiconductor device for reducing power consumption. In a method for driving a semiconductor device of one embodiment of the present invention, in a first period, a switch configured to control an electrical connection between a first wiring and a second wiring together with an n-channel transistor and a p-channel transistor is in an off state during a period in which the states of the n-channel transistor and the p-channel transistor gates of which are electrically connected to each other are switched between an on state and an off state. In a second period, the switch is set to be in an off state. The switch has a channel formation region in a semiconductor, band gap of which is higher than silicon and intrinsic carrier density of which is lower than silicon.

20 Claims, 12 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,207,756 B2 | 6/2012 | Shionoiri et al. |
| 8,400,187 B2 | 3/2013 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101333 A1 | 5/2011 | Shionoiri et al. |
| 2011/0140099 A1 | 6/2011 | Yamazaki |
| 2011/0278564 A1 | 11/2011 | Yoneda |
| 2012/0292616 A1 | 11/2012 | Ohshima |
| 2012/0299626 A1 | 11/2012 | Fujita et al. |
| 2014/0043093 A1 | 2/2014 | Yamazaki et al. |
| 2014/0043094 A1* | 2/2014 | Yamazaki et al. ............ 327/437 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-210976 A | 8/1993 |
| JP | 05-251705 A | 9/1993 |
| JP | 07-202677 A | 8/1995 |
| JP | 08-264794 A | 10/1996 |
| JP | 11-505377 A | 5/1999 |
| JP | 11-177408 A | 7/1999 |
| JP | 2000-044236 A | 2/2000 |
| JP | 2000-150900 A | 5/2000 |
| JP | 2001-044822 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: the "Blue Phase," Physics Letters, Sep. 10, 1973, vol. 45A, No. 2, pp. 115-116.

(56) References Cited

OTHER PUBLICATIONS

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using Cg-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMCLD Panel Using IgZo Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

(56) References Cited

OTHER PUBLICATIONS

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (M<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide.Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

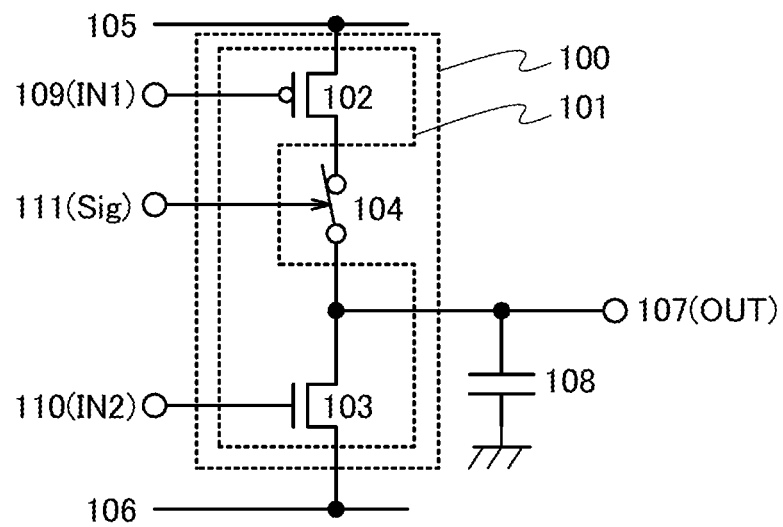
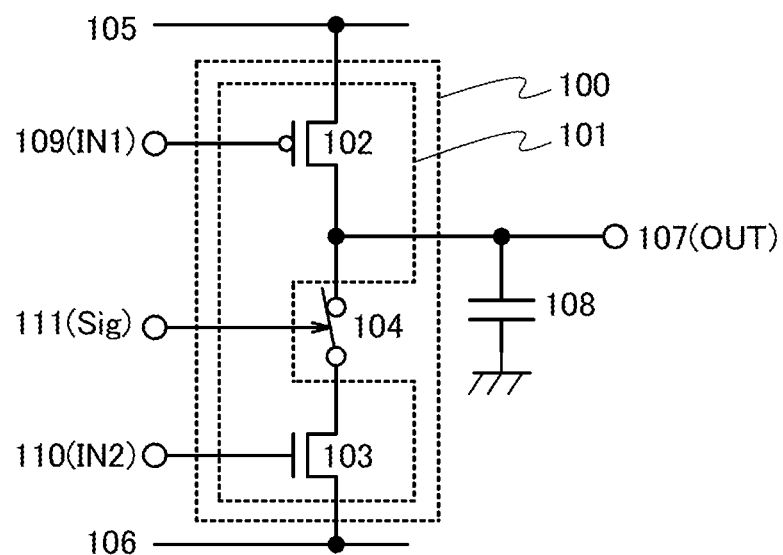

METHOD FOR DRIVING SEMICONDUCTOR DEVICE

BACKGROUND OF THE INVENTION

1. Field of the Invention

The present invention relates to a semiconductor device including a complementary logic circuit and a driving method thereof.

2. Description of the Related Art

In recent years, a metal oxide showing semiconductor characteristics, which is called an oxide semiconductor, has attracted attention as a novel semiconductor material having high mobility which can be obtained by polysilicon and having uniform element characteristics which can be obtained by amorphous silicon. The metal oxide is used for various applications. For example, indium oxide is a well-known metal oxide and used as a material of a transparent electrode included in a liquid crystal display device or the like. Examples of such metal oxides having semiconductor characteristics include tungsten oxide, tin oxide, indium oxide, and zinc oxide. Transistors in each of which a channel formation region is formed using such a metal oxide having semiconductor characteristics have been known (Patent Documents 1 and 2).

REFERENCE

[Patent Document 1] Japanese Published Patent Application No. 2007-123861
[Patent Document 2] Japanese Published Patent Application No. 2007-096055

SUMMARY OF THE INVENTION

In a complementary logic circuit which is formed using a p-channel transistor and an n-channel transistor in combination, one of the transistors is turned on and the other of the transistors is turned off depending on which level of a potential is applied to the transistors, a high or low level; consequently, a logic value which is output from the logic circuit is determined. However, when the potentials of the gate electrodes are switched from a high level to a low level or from a low level to a high level, both of the transistors are turned on in some cases, only for a short period of time, depending on the threshold voltages of the p-channel transistor and the n-channel transistor. During the period, a current called a shoot-through current flows between wirings electrically connected to the p-channel transistor and the n-channel transistor, and power is consumed due to the shoot-through current.

In silicon transistors which are used for general semiconductor devices, off-state current flows between a source and a drain of each silicon transistor even when the silicon transistor are in an off state. In the case of applying such transistors to a complementary logic circuit, the off-state current flows between wirings with a potential difference through a p-channel transistor and an n-channel transistor, and thus power is consumed due to the off-state current. In the case of an inverter manufactured using bulk silicon for example, an off-state current of about 1 pA is generated at room temperature at a potential difference between wirings of about 3 V, although it depends on the size of a transistor.

The power consumption due to the shoot-through current or off-state current increases as the integration degree of an integrated circuit including a complementary logic circuit is increased.

Under the technical background, it is an object of the present invention to provide a low-power semiconductor device. It is an object of the present invention to provide a driving method of a semiconductor device for reducing power consumption.

In one embodiment of the present invention, a switch which uses a transistor having a very low off-state current is provided on a path of shoot-through current or off-state current which is to be formed between two wirings and through a complementary logic circuit. To electrically interrupt the path, the switch is set to be in an off state during a period in which the states of a p-channel transistor and an n-channel transistor included in the complementary logic circuit are switched between an on state and an off state. In one embodiment of the present invention, by the operation, shoot-through current is prevented from flowing through the p-channel transistor and the n-channel transistor in a period in which the states of the p-channel transistor and the n-channel transistor are switched between an on state and an off state, whereby power consumption due to the shoot-through current can be prevented.

In one embodiment of the present invention, when the logic circuit is in a standby mode, for example, the switch may be in an off state regardless of the states of the p-channel transistor and the n-channel transistor. In one embodiment of the present invention, by the operation, power consumption due to off-state current of the p-channel transistor or the n-channel transistor in the logic circuit can be prevented.

Specifically, a semiconductor device of one embodiment of the present invention includes an n-channel transistor and a p-channel transistor, gates of which are electrically connected to each other, and a switch configured to control an electrical connection between a first wiring and a second wiring together with the n-channel transistor and the p-channel transistor. The switch uses a transistor having a channel formation region in a semiconductor, band gap of which is higher than silicon and intrinsic carrier density of which is lower than silicon.

In a method for driving a semiconductor device of one embodiment of the present invention, in a first period, a switch configured to control an electrical connection between a first wiring and a second wiring together with an n-channel transistor and a p-channel transistor is in an off state during a period in which the states of the n-channel transistor and the p-channel transistor are switched between an on state and an off state, gates of which are electrically connected to each other. In a second period, the switch is always off. The switch uses a transistor having a channel formation region in a semiconductor, band gap of which is higher than silicon and intrinsic carrier density of which is lower than silicon.

In one embodiment of the present invention, with the above structure, a low-power semiconductor device can be obtained. In one embodiment of the present invention, with the above structure, a driving method of a semiconductor device for reducing power consumption can be obtained.

BRIEF DESCRIPTION OF THE DRAWINGS

FIGS. 2A and 2B are diagrams each illustrating a structure of a semiconductor device.

DETAILED DESCRIPTION OF THE INVENTION

Figure 1A:
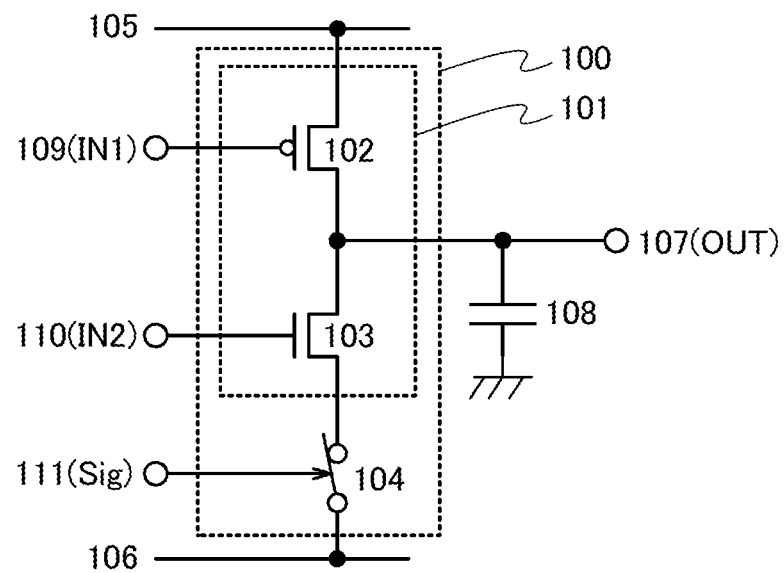
FIGS. 1A and 1B are diagrams each illustrating a structure of a semiconductor device.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Note that the present invention includes, in its category, any semiconductor device including complementary logic circuit, for example, integrated circuits, RF tags, and semiconductor display devices. The integrated circuits include, in its category, large scale integrated circuits (LSIs) including a microprocessor, an image processing circuit, a digital signal processor (DSP), a microcontroller, and the like, and programmable logic devices (PLDs) such as a field programmable gate array (FPGA) and a complex PLD (CPLD). The semiconductor display devices include the following in the category: liquid crystal display devices, light-emitting devices in which a light-emitting element typified by an organic light-emitting diode (OLED) is provided for each pixel, electronic paper, electronic book readers, digital micromirror devices (DMDs), plasma display panels (PDPs), field emission displays (FEDs), and other semiconductor display devices in which a driver circuit including a complementary logic circuit is included.

Note that "connection" in this specification means electrical connection and corresponds to the state in which current, voltage, or potential can be supplied, applied, or conducted. Accordingly, a connection state means not only a state of a direct connection but also a state of indirect connection through a circuit element such as a wiring, a resistor, a diode, or a transistor so that current, a potential, or voltage can be supplied, applied, or conducted. In addition, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

A "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

The terms "source" and "drain" of a transistor interchange with each other depending on the type of the channel of the transistor or levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Embodiment 1

Figure 1B:
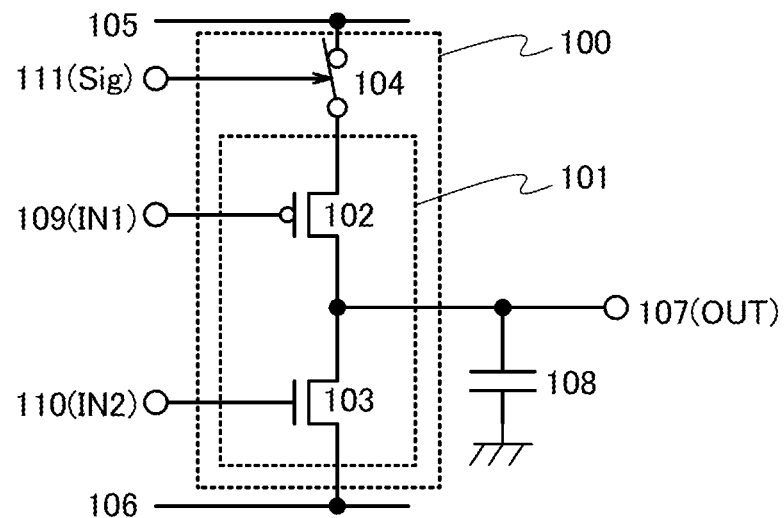

A structure of a semiconductor device of one embodiment of the present invention is illustrated in FIGS. 1A and 1B, as an example.

A semiconductor device 100 illustrated in FIG. 1A includes a logic circuit 101 and a switch 104. The logic circuit 101 includes a p-channel transistor 102 and an n-channel transistor 103. In FIG. 1A, the logic circuit 101 has one p-channel transistor 102 and one n-channel transistor 103, for example. As long as the logic circuit 101 has at least one p-channel transistor 102 and one n-channel transistor 103, the number of p-channel transistors 102 and the number of n-channel transistor 103 can be plural.

In addition to the p-channel transistor 102 and the n-channel transistor 103, the logic circuit 101 may have one or more of semiconductor elements, such as diodes, capacitors, resistors, and inductances, which are minimum units for constructing a circuit.

In the semiconductor device 100 of one embodiment of the present invention, a logic value of an input signal IN input to a gate of at least one p-channel transistor agrees with a logic value of an input signal IN input to a gate of at least one n-channel transistor. In FIG. 1A, an input signal IN1 and an input signal IN2 are input to a gate of the p-channel transistor 102 and a gate of the n-channel transistor 103, respectively. Logic values of the input signal IN1 and the input signal IN2 agree with each other.

Note that even when the logic values of the input signal IN1 and the input signal IN2 agree with each other, the potentials of the input signal IN1 and the input signal IN2 are not always the same as each other. The potentials of the input signal IN1 and the input signal IN2 may be either the same as or different from each other.

In the logic circuit 101, logical operation to be performed is uniquely determined in accordance with the number and connection structure of the p-channel transistor 102 and the n-channel transistor 103. Then, in the semiconductor device 100, one output value can be obtained from a plurality of input values by the logical operation which is performed in the logic circuit 101. Note that an input value means a logic value determined by the potential of the input signal IN input to the semiconductor device 100, such as the input signal IN1 or the input signal IN2. An output value means a logic value determined by the potential of an output signal OUT output from the semiconductor device 100.

Specifically, the logic circuit 101 may be a basic logic gate such as an inverter, a NAND, a NOR, an AND, or an OR, may be a circuit that is a combination of these logic gates, such as a flip-flop, a register, or a shift register, or may be a large-scale arithmetic circuit that is a combination of a plurality of circuits described above.

The semiconductor device 100 is electrically connected to a wiring 105 to which a high-level potential VDD is applied, a wiring 106 to which a low-level potential VSS is applied, and a wiring 107 to which the output signal OUT from the semiconductor device 100 is input. The p-channel transistor 102, the n-channel transistor 103, and the switch 104 are connected in series. The switch 104 has a function of controlling an electrical connection between the wiring 105 and the wiring 106, as the p-channel transistor 102 and the n-channel transistor 103 do. The p-channel transistor 102 has a function of controlling an electrical connection between the wiring 105 and the wiring 107 in accordance with the input signal IN1 which is input to the gate of the p-channel transistor 102 through a wiring 109. The n-channel transistor 103 has a function of controlling an electrical connection between the wiring 106 and the wiring 107 in accordance with the input signal IN2 which is input to the gate of the n-channel transistor 103 through the wiring 110.

Specifically, in FIG. 1A, one of a source and a drain of the p-channel transistor 102 is electrically connected to the wiring 105 and the other of the source and the drain of the p-channel transistor 102 is electrically connected to the wiring 107. In addition, one of a source and a drain of the n-channel transistor 103 is electrically connected to the wiring 106 through the switch 104 and the other of the source and the drain of the n-channel transistor 103 is electrically connected to the wiring 107.

The wiring 107 to which the output signal is applied includes capacitance such as parasitic capacitance. Such capacitance is referred to as a capacitor 108 in FIG. 1A.

The switch 104 is turned on or off in accordance with a signal Sig input to the switch 104 through a wiring 111.

In FIG. 1A, the switch 104 is provided between the one of the source and the drain of the n-channel transistor 103 and the wiring 106, for example. However, the switch 104 may be provided anywhere as long as the switch 104 is connected to the p-channel transistor 102 and the n-channel transistor 103 in series between the wiring 105 and the wiring 106.

FIG. 1B illustrates another structure of the semiconductor device 100 of one embodiment of the present invention, as an example. The semiconductor device 100 illustrated in FIG. 1B is different from the semiconductor device 100 illustrated in FIG. 1A in that the switch 104 is provided between the wiring 105 and the p-channel transistor 102.

Specifically, in the semiconductor device 100 illustrated in FIG. 1B, the one of the source and the drain of the p-channel transistor 102 is electrically connected to the wiring 105 through the switch 104 and the other of the source and the drain of the p-channel transistor 102 is electrically connected to the wiring 107. The one of the source and the drain of the n-channel transistor 103 is electrically connected to the wiring 106 and the other of the source and the drain of the n-channel transistor 103 is electrically connected to the wiring 107.

FIG. 2A illustrates another structure of the semiconductor device 100 of one embodiment of the present invention, as an example. The semiconductor device 100 illustrated in FIG. 2A is different from the semiconductor device 100 illustrated in FIG. 1A in that the switch 104 is provided between the p-channel transistor 102 and the n-channel transistor 103.

Specifically, in the semiconductor device 100 illustrated in FIG. 2A, the one of the source and the drain of the p-channel transistor 102 is electrically connected to the wiring 105 and the other of the source and the drain of the p-channel transistor 102 is electrically connected to the wiring 107 and the other of the source and the drain of the n-channel transistor 103 through the switch 104.

FIG. 2B illustrates another structure of the semiconductor device 100 of one embodiment of the present invention, as an example. The semiconductor device 100 illustrated in FIG. 2B is different from the semiconductor device 100 illustrated in FIG. 1A in that the switch 104 is provided between the p-channel transistor 102 and the n-channel transistor 103.

Specifically, in the semiconductor device 100 illustrated in FIG. 2B, the one of the source and the drain of the n-channel transistor 103 is electrically connected to the wiring 106 and the other of the source and the drain of the n-channel transistor 103 is electrically connected to the wiring 107 and the other of the source and the drain of the p-channel transistor 102 through the switch 104.

Note that although the semiconductor device 100 has one switch 104 in FIGS. 1A and 1B and FIGS. 2A and 2B for example, a semiconductor device of one embodiment of the present invention may have a plurality of switches 104. In this case, the positions of the switches 104 in the semiconductor device can be the same as one or more of the positions of the switches 104 in the semiconductor devices 100 in FIGS. 1A and 1B and FIGS. 2A and 2B.

In one embodiment of the present invention, a transistor which has an off-state current much lower than the off-state current of the p-channel transistor 102 and the n-channel transistor 103 is used for the switch 104. A transistor where a channel formation region is formed in a semiconductor film, a band gap of which is wider than that of silicon and an intrinsic carrier density of which is lower than that of silicon, can have an off-state current much lower than that of a transistor where a channel formation region is formed in a semiconductor film of silicon or germanium. Therefore, the former is suitable for the switch 104.

In particular, a highly purified oxide semiconductor (a purified oxide semiconductor) obtained by reduction of impurities such as moisture or hydrogen which serve as electron donors (donors) and reduction of oxygen vacancies is an intrinsic (i-type) semiconductor or a substantially i-type semiconductor. For this reason, a transistor having a channel formation region in a highly purified oxide semiconductor film has extremely low off-state current and high reliability.

Specifically, various experiments can prove low off-state current of a transistor including a channel formation region in a highly purified oxide semiconductor film. For example, even when an element has a channel width of $1 \times 10^6$ μm and a channel length of 10 μm, off-state current can be less than or equal to the measurement limit of a semiconductor parameter analyzer, i.e., less than or equal to $1 \times 10^{-13}$ A, at voltage (drain voltage) between the source electrode and the drain electrode of from 1 V to 10 V. In this case, it can be seen that the off-state current standardized on the channel width of the transistor is lower than or equal to 100 zA/μm. In addition, a capacitor and a transistor are connected to each other and the off-state current is measured with a circuit in which charge flowing into or from the capacitor is controlled by the transistor. In the measurement, a highly purified oxide semiconductor film was used for a channel formation region of the transistor, and the off-state current of the transistor was measured from a change in the amount of electrical charge of the capacitor per unit hour. As a result, it was found that, in the case where the voltage between the source electrode and the drain electrode of the transistor is 3 V, a lower off-state current of several tens of yA/μm is obtained. Accordingly, the off-state current of the transistor in which the highly purified oxide semiconductor film is used as a channel formation region is considerably lower than that of a transistor in which silicon having crystallinity is used.

Unless otherwise specified, in the case of an n-channel transistor, off-state current in this specification is a current that flows between a source and a drain when the potential of a gate is lower than or equal to zero with the potential of the source as a reference potential while the potential of the drain is higher than those of the source and the gate. Moreover, in the case of a p-channel transistor, the off-state current in this specification is a current that flows between a source and a drain when the potential of a gate is higher than or equal to zero with the potential of the source as a reference potential while the potential of the drain is lower than those of the source and the gate.

In one embodiment of the present invention, at least the switch 104 has a channel formation region in the above wide band gap semiconductor. In the description below, a transistor where a channel formation region is formed in an oxide semiconductor with the above advantages is used for the switch 104, for example.

For semiconductor elements such as the p-channel transistor 102 and the n-channel transistor 103 included in the logic circuit 101, a semiconductor such as amorphous silicon, microcrystalline silicon, polycrystalline silicon, single crystal silicon, amorphous germanium, microcrystalline germanium, polycrystalline germanium, or single crystal germanium can be used. As silicon, amorphous silicon formed by a sputtering method or a vapor deposition method such as a plasma CVD method, polycrystalline silicon obtained in such a manner that amorphous silicon is crystallized by laser annealing or the like, single crystal silicon obtained in such a manner that a surface portion of a single crystal silicon wafer is separated by implantation of hydrogen ions or the like into the silicon wafer, or the like can be used. In particular, in the case where the semiconductor device 100 is required to operate at high speed, polycrystalline silicon, polycrystalline germanium, single crystal silicon, or single crystal germanium all of which have high mobility is preferably used for the p-channel transistor 102 or the n-channel transistor 103 of the logic circuit 101.

Next, one example of a method for driving a semiconductor device of one embodiment of the present invention is described.

Figure 3:
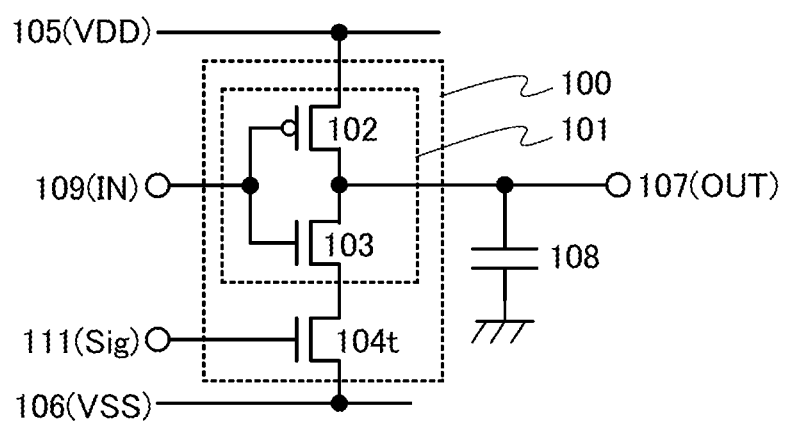
FIG. 3 is a diagram illustrating a structure of a semiconductor device.

First, FIG. 3 shows the structure of the semiconductor device 100 which is different from that of the semiconductor device 100 illustrated in FIG. 1A in that the wiring 109 and the wiring 110 in the semiconductor device 100 illustrated in FIG. 1A are electrically connected to each other and the transistor 104*t* is used as the switch 104, for example.

Specifically, FIG. 3 illustrates the wiring 109 and the wiring 110 as one wiring, the wiring 109. Therefore, in FIG. 3, the input signal IN is supplied to the gate of the p-channel transistor 102 and the gate of the n-channel transistor 103 through the wiring 109.

In FIG. 3, one of a source and a drain of the transistor 104*t* is electrically connected to the wiring 106, and the other of the source and the drain of the transistor 104*t* is electrically connected to the one of the source and the drain of the n-channel transistor 103.

The signal Sig is supplied to a gate of the transistor 104*t* through the wiring 111. When the potential of the signal Sig is high, the transistor 104*t* is in an on state. When the potential of the signal Sig is low, the transistor 104*t* is in an off state.

FIG. 3 shows the semiconductor device 100 including one the transistor 104*t* which functions as the switch 104. However, the present invention is not limited to this structure. In one embodiment of the present invention, a plurality of transistors may function as one switch 104. In the case where the semiconductor device 100 includes a plurality of transistors which function as the switches 104, the plurality of transistors may be connected to each other in parallel, in series, or in combination of parallel connection and series connection.

Note that the state in which transistors are connected to each other in series means the state in which only one of a source and a drain of a first transistor is connected to only one of a source and a drain of a second transistor. The state in which the transistors are connected to each other in parallel refers to the state in which the source of the first transistor is connected to the source of the second transistor and the drain of the first transistor is connected to the drain of the second transistor.

The transistor 104*t* which functions as a switch has at least a gate which is on one side of a semiconductor film (front gate). Note that the present invention is not limited to this structure. The transistor 104*t* may have a gate (back gate) which is provided on the other side of the semiconductor film so as to overlap with the front gate with the semiconductor film laid therebetween.

The back gate may be floating or may be supplied with a potential from another element. In the latter case, potentials at the same level may be applied to the front gate and the back gate, or a fixed potential such as a ground potential may be applied only to the back gate. By controlling the potential applied to the back gate, the threshold voltage of the transistor 104*t* can be controlled. Accordingly, the off-state current of the transistor 104*t* can be further reduced. By providing the back gate, a channel formation region is enlarged and the drain current can be increased. Moreover, providing the back gate facilitates formation of a depletion layer in the semiconductor film, which results in lower subthreshold swing.

Figure 4:
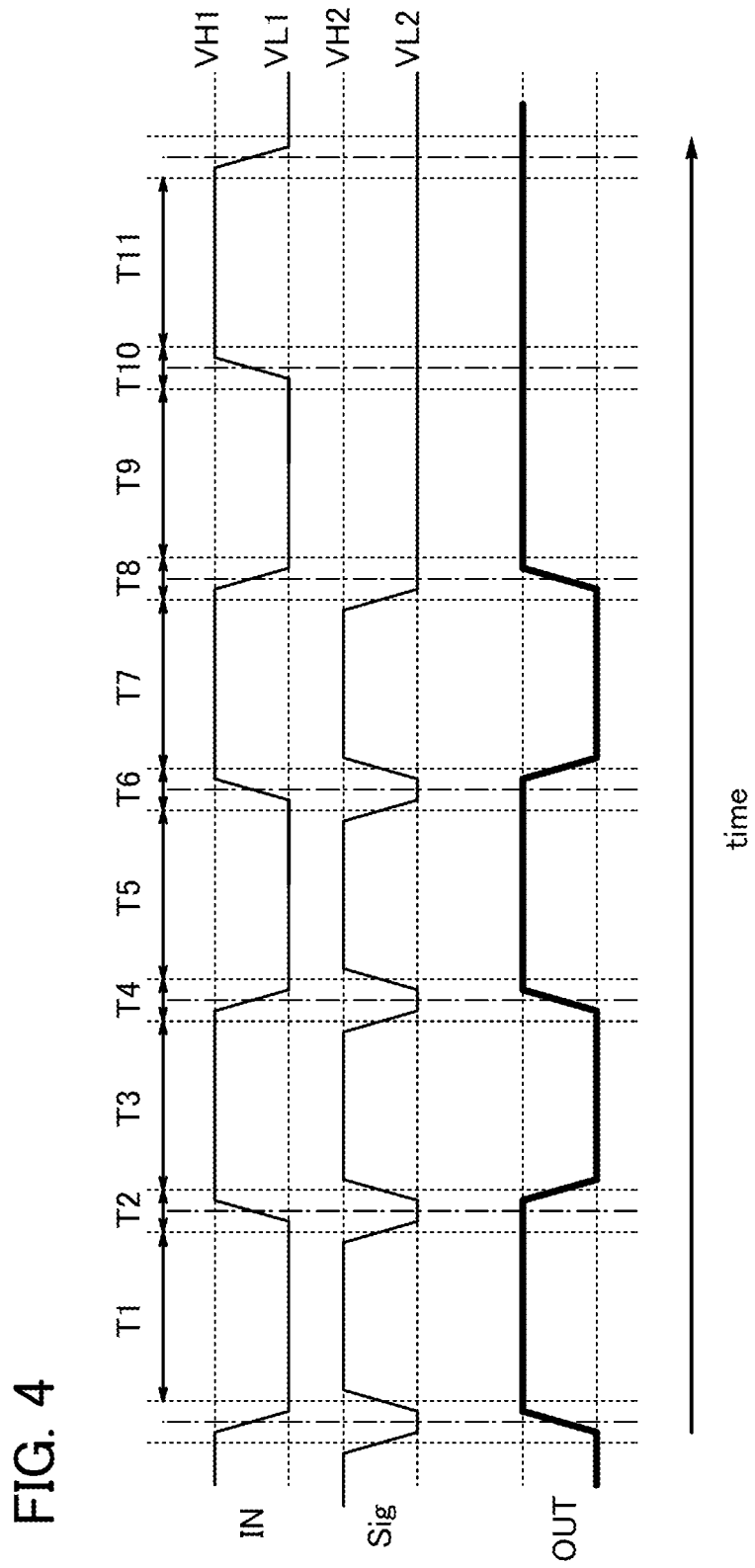
FIG. 4 is a timing chart.

Next, FIG. 4 shows a timing chart of the potentials of the input signal IN, the signal Sig, and the output signal OUT in the semiconductor device 100 illustrated in FIG. 3.

As shown in FIG. 4, in a period T1 and a period T5, the input signal IN is at a low-level potential VL1; accordingly, the p-channel transistor 102 is in an on state and the n-channel transistor 103 is in an off state. Therefore, the potential VDD applied to the wiring 105 is applied to the wiring 107 as the potential of the output signal OUT through the p-channel transistor 102. Note that in the period T1 and the period T5, the signal Sig is at a high-level potential VH2; accordingly, the transistor 104*t* is in an on state.

As shown in FIG. 4, in a period T3 and a period T7, the input signal IN is at a high-level potential VH1; accordingly, the p-channel transistor 102 is in an off state and the n-channel transistor 103 is in an on state. Further, in the period T3 and the period T7, the signal Sig is at the high-level potential VH2; accordingly, the transistor 104*t* is in an on state. Therefore, the potential VSS applied to the wiring 106 is applied to the wiring 107 as the potential of the output signal OUT through the n-channel transistor 103 and the transistor 104*t*.

As shown in FIG. 4, in a period T2 and a period T6, the potential of the input signal IN changes from the low-level potential VL1 to the high-level potential VH1. Accordingly, the period T2 and the period T6 each correspond to a transition time in which the p-channel transistor 102 changes from an on state to an off state and the n-channel transistor 103 changes from an off state to an on state. Therefore, sometimes, both of the p-channel transistor 102 and the n-channel transistor 103 are in an on state in the period T2 and the period T6, depending on a threshold voltage Vthp of the p-channel transistor 102 or a threshold voltage Vthn of the n-channel transistor 103.

As shown in FIG. 4, in a period T4 and a period T8, the potential of the input signal IN changes from the high-level potential VH1 to the low-level potential VL1. Accordingly, the period T4 and the period T8 each correspond to a transition time in which the p-channel transistor 102 changes from an off state to an on state and the n-channel transistor 103 changes from an on state to an off state. Therefore, sometimes, both of the p-channel transistor 102 and the n-channel transistor 103 are in an on state in the period T4 and the period T8, depending on a threshold voltage Vthp of the p-channel transistor 102 or a threshold voltage Vthn of the n-channel transistor 103.

Shoot-through current which flows through the p-channel transistor 102 and the n-channel transistor 103 in transition times such as the periods T2, T4, T6, and T8 in which the states of the p-channel transistor 102 and the n-channel transistor 103 are switched between an on state and an off state will be described below. Note that in FIG. 5, assume that the transistor 104t is in an on state.

Figure 5:
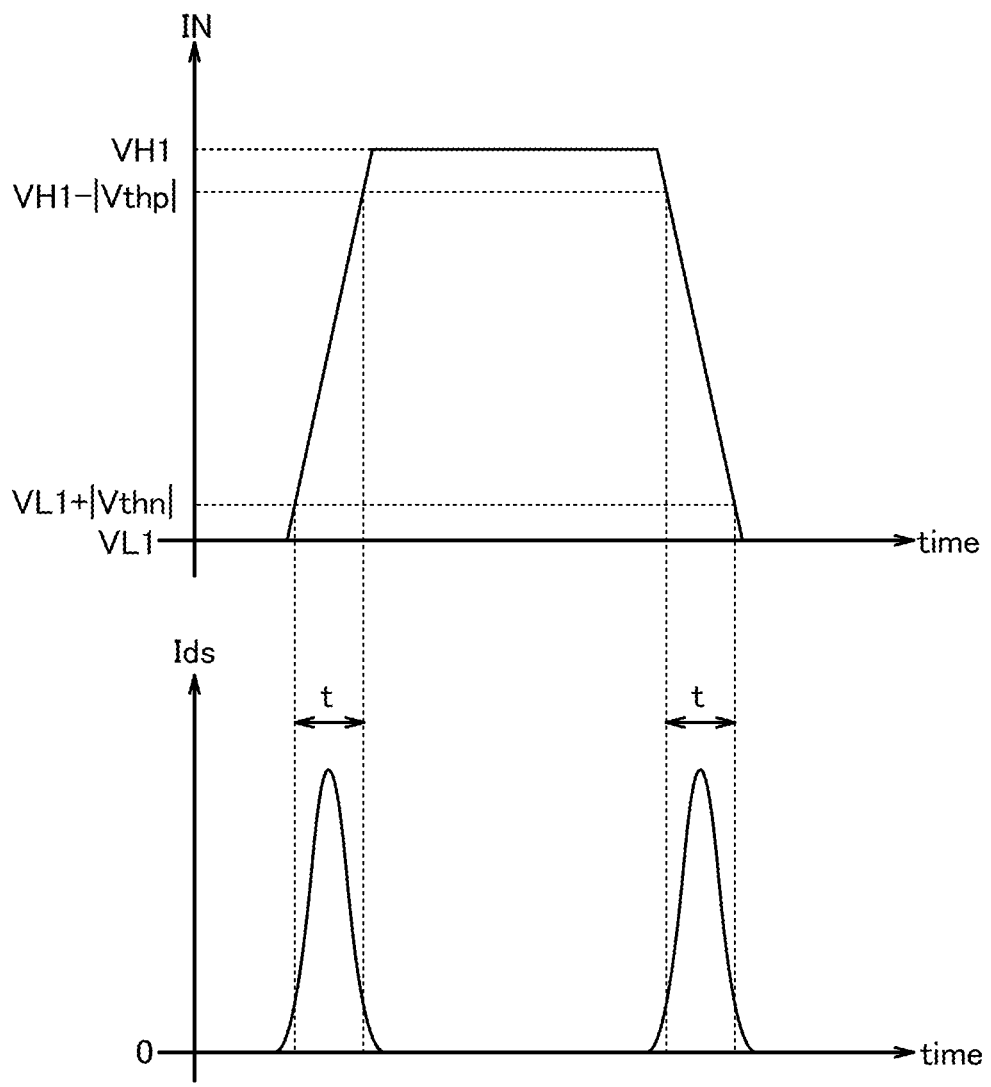
FIG. 5 is a timing chart of an input signal IN and a diagram illustrating one example of change of current Ids with time.

FIG. 5 shows one example of a timing chart of the potential of the input signal N. In the timing chart, the potential of the input signal IN changes from the low-level potential VL1 to the high-level potential VH1, and then changes from the high-level potential VH1 to the low-level potential VL1. FIG. 5 also shows one example of change over time of current Ids. The current Ids is a current flowing through the p-channel transistor 102 and the n-channel transistor 103. Note that the time axis in the timing chart of the potential of the input signal IN corresponds to that in the change over time of current Ids.

In complementary logic circuits, it is preferable to instantly change the potential of the input signal IN to reduce shoot-through current. However, each logic circuit has loads such as gate capacitance of a transistor and parasitic capacitance of wiring or the like, and charging or discharging of the loads is performed in accordance with change of the potential of the input signal IN. Therefore, in order that the potential of the input signal IN changes from the low-level potential to the high-level potential or changes from the high-level potential to the low-level potential, a predetermined period of time is needed.

In the timing chart of the input signal IN shown in FIG. 5, changing of the potential of the input signal IN from the low-level potential VL1 to the high-level potential VH1 takes a predetermined time. In addition, changing of the potential of the input signal IN from the high-level potential VH1 to the low-level potential VL1 takes a predetermined time.

In addition, assuming that the threshold voltage of the p-channel transistor 102 is Vthp and the threshold voltage of the n-channel transistor 103 is Vthn, in FIG. 5, both of the p-channel transistor 102 and the n-channel transistor 103 are in an on state in a period t in which the potential of the input signal IN is not lower than VL1+|Vthn| and not higher than VH1−|Vthp|. Thus, as shown in FIG. 5, the current Ids is high in the period t. The current Ids flowing in the period t corresponds to shoot-through current.

In one embodiment of the present invention, the switch 104 in the semiconductor device 100 illustrated in FIGS. 1A and 1B and FIGS. 2A and 2B is set to be in an off state during a period in which the states of the p-channel transistor 102 and the n-channel transistor 103 are switched between an on state and an off state; thus, a current path between the wiring 105 and the wiring 106 through the logic circuit 101 is electrically interrupted.

Specifically, in the case of the semiconductor device 100 illustrated in FIG. 3, the potential of the signal Sig is set to a low-level potential VL2 to turn off the transistor 104t in the period T2, the period T4, the period T6, the period T8, and a period T10, as shown in FIG. 4.

In one embodiment of the present invention, by the operation, the current Ids can be prevented from flowing in the period t, resulting in preventing power consumption due to the current Ids.

Note that in the case of the semiconductor device 100 illustrated in FIG. 3, the input signal IN is at the low-level potential VL1 in the period T1 and the period T5; accordingly, the n-channel transistor 103 is in an off state, and the wiring 106 and the wiring 107 are electrically disconnected from each other. In FIG. 3, the transistor 104t, together with the n-channel transistor 103, has a function of controlling an electrical connection between the wiring 106 and the wiring 107. Therefore, in the case of the semiconductor device 100 illustrated in FIG. 3, the transistor 104t may be in an off state in the period T1 and the period T5. The transistor 104t is turned off in not only a period in which the potential of the input signal IN change but also a period in which the n-channel transistor 103 is in an off state, resulting in preventing power consumption due to not only shoot-through current but also off-state current through the n-channel transistor 103.

This operation can be used for the semiconductor device 100 in which as shown in FIG. 1A and FIG. 2B, the switch 104, together with the n-channel transistor 103, has a function of controlling an electrical connection between the wiring 106 and the wiring 107. In the case of the semiconductor device 100 in which the switch 104, together with the p-channel transistor 102, has a function of controlling an electrical connection between the wiring 105 and the wiring 107 as shown in FIG. 1B and FIG. 2A, the switch 104 is turned off during a period, such as the period T3 or the period T7, in which the p-channel transistor 102 is in an off state. In this case, this operation can prevent power consumption due to not only shoot-through current but also off-state current through the p-channel transistor 102.

Further, in one embodiment of the present invention, when the logic circuit 101 is in a standby mode for example, the signal Sig is set at the low-level potential VL2 so that the transistor 104t is turned off, regardless of the potential of the input signal IN as shown in a period T9 to a period T11 in FIG. 4.

Specifically, in the period T9, the input signal IN is at the low-level potential VL1; accordingly, the p-channel transistor 102 is in an on state and the n-channel transistor 103 is in an off state. Therefore, the potential VDD applied to the wiring 105 is applied to the wiring 107 as the potential of the output signal OUT through the p-channel transistor 102. In one embodiment of the present invention, the transistor 104t is in an off state in the period, and therefore the off-state current of the n-channel transistor 103 is prevented from flowing between the wiring 105 and the wiring 106, and power consumption due to the off-state current can be prevented.

In the period T10, the potential of the input signal IN changes from the low-level potential VL1 to the high-level potential VH1. Accordingly, the p-channel transistor 102 changes from an on state to an off state and the n-channel transistor 103 changes from an off state to an on state. In one embodiment of the present invention, the transistor 104t is in an off state in the period, and therefore shoot-through current is prevented from flowing between the wiring 105 and the wiring 106, and power consumption due to the off-state current can be prevented.

In the period T11, the input signal IN is at the high-level potential VH1; accordingly, the p-channel transistor 102 is in an off state and the n-channel transistor 103 is in an on state. Note that in one embodiment of the present invention, the transistor 104t is in an off state in the period; accordingly, the wiring 107 is electrically disconnected from the wiring 105 and the wiring 106. Therefore, the capacitor 108 holds the potential VDD applied to the wiring 107 in the period T9. In one embodiment of the present invention, by the operation, the off-state current of the p-channel transistor 102 is prevented from flowing between the wiring 105 and the wiring 106, and power consumption due to the off-state current can be prevented.

Therefore, in the semiconductor device of one embodiment of the present invention, shoot-through current and off-state current can be reduced; thus, power consumption can be suppressed. Alternatively, in the semiconductor device of one embodiment of the present invention, shoot-through current and off-state current can be reduced; thus, heat generation can be suppressed and reliability of the semiconductor device can be improved.

In addition, by reducing power consumption of the semiconductor device, a load of another circuit controlling the operation of the semiconductor device can be reduced. Accordingly, functional extension of the semiconductor device and an integrated circuit including another circuit which controls the semiconductor device can be performed as a whole.

In particular, the size of transistors tends to be large in a logic circuit requiring large current supply capability. One example of such a logic circuit is a driver circuit in a semiconductor display device which inputs a signal to wirings, such as scan lines and signal lines, which are called bus lines connected to a plurality of pixels. Such a logic circuit therefore has a large load, and instant change in the potential of the input signal IN is difficult. Thus, when the structure of one embodiment of the present invention is used for a logic circuit requiring large current supply capability, power consumption of a logic circuit and power consumption of a semiconductor display device using the logic circuit can be effectively reduced.

Next, the case where the semiconductor device 100 illustrated in FIG. 1A has NAND as the logic circuit 101 is given as an example, and a specific configuration of the semiconductor device 100 of one embodiment of the present invention will be described.

Figure 6A:
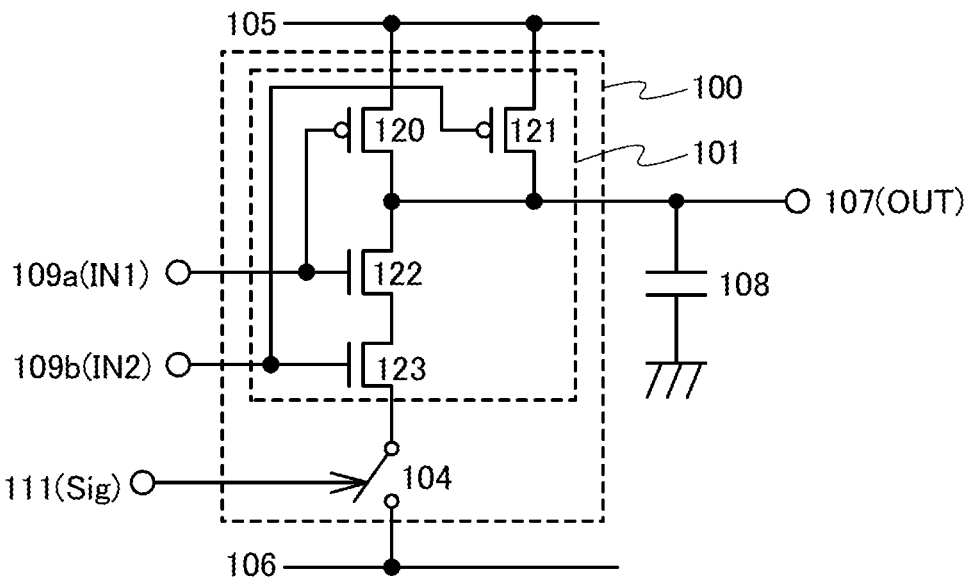
FIGS. 6A and 6B are diagrams each illustrating a structure and an operation of a semiconductor device including a NAND.

In the semiconductor device 100 illustrated in FIG. 6A, the logic circuit 101 includes a p-channel transistor 120, a p-channel transistor 121, an n-channel transistor 122, and an n-channel transistor 123.

Specifically, one of a source and a drain of the p-channel transistor 120 and one of a source and a drain of the p-channel transistor 121 are electrically connected to the wiring 105 to which the potential VDD is applied. A gate of the p-channel transistor 120 and a gate of the n-channel transistor 122 are electrically connected to a wiring 109a to which the potential of the input signal IN1 is applied. The other of the source and the drain of the p-channel transistor 120, the other of the source and the drain of the p-channel transistor 121, and one of a source and a drain of the n-channel transistor 122 are electrically connected to the wiring 107 to which the output signal OUT is input. The wiring 107 to which the output signal OUT is input has capacitance such as parasitic capacitance, and such capacitance is shown as the capacitor 108 in FIG. 6A. The other of the source and the drain of the n-channel transistor 122 is electrically connected to one of a source and a drain of the n-channel transistor 123. A gate of the p-channel transistor 121 and a gate of the n-channel transistor 123 are electrically connected to a wiring 109b to which the potential of the input signal IN2 is applied. The other of the source and the drain of the n-channel transistor 123 and the wiring 106 to which the low-level potential VSS is applied are electrically connected through the switch 104.

Next, the case where the semiconductor device 100 illustrated in FIG. 1B has NAND as the logic circuit 101 is given as an example, and a specific configuration of the semiconductor device 100 of one embodiment of the present invention will be described.

Figure 6B:
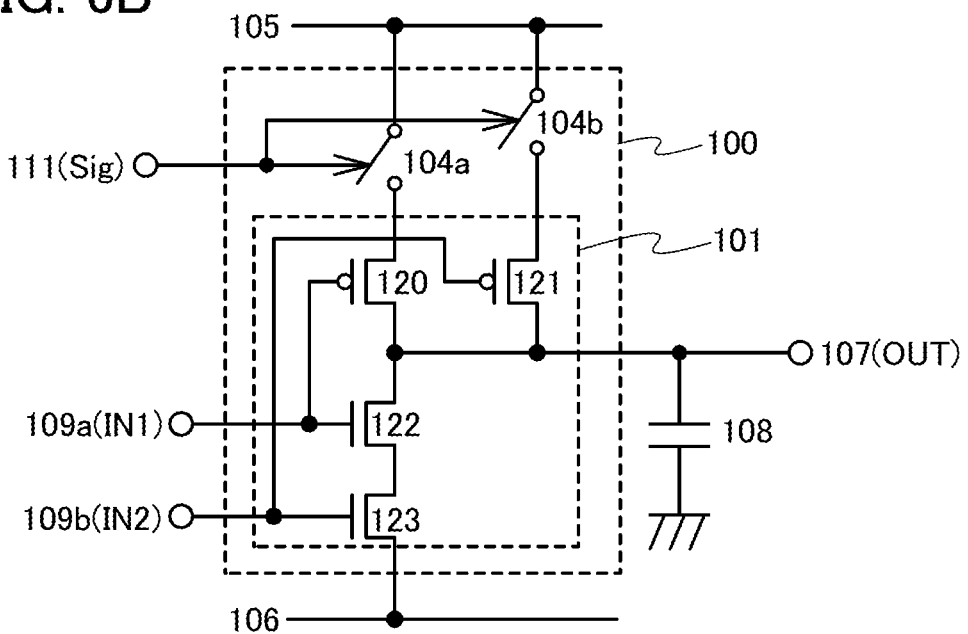

In the semiconductor device 100 illustrated in FIG. 6B, the logic circuit 101 includes the p-channel transistor 120, the p-channel transistor 121, the n-channel transistor 122, and the n-channel transistor 123, as in FIG. 6A.

Specifically, the one of the source and the drain of the p-channel transistor 120 and the wiring 105 to which the potential VDD is applied are electrically connected through a switch 104a. The one of the source and the drain of the p-channel transistor 121 and the wiring 105 to which the potential VDD is applied are electrically connected through a switch 104b. The gate of the p-channel transistor 120 and the gate of the n-channel transistor 122 are electrically connected to the wiring 109a to which the potential of the input signal IN1 is applied. The other of the source and the drain of the p-channel transistor 120, the other of the source and the drain of the p-channel transistor 121, and the one of the source and the drain of the n-channel transistor 122 are electrically connected to the wiring 107 to which the output signal OUT is input. The wiring 107 to which the output signal OUT is input has capacitance such as parasitic capacitance, and such capacitance is shown as the capacitor 108 in FIG. 6B. The other of the source and the drain of the n-channel transistor 122 is electrically connected to the one of the source and the drain of the n-channel transistor 123. The gate of the p-channel transistor 121 and the gate of the n-channel transistor 123 are electrically connected to the wiring 109b to which the potential of the input signal IN2 is applied. The other of the source and the drain of the n-channel transistor 123 is electrically connected to the wiring 106 to which the low-level potential VSS is applied.

FIG. 6B shows an example in which an electrical connection between the wiring 105 and the logic circuit 101 is controlled by the switch 104a and the switch 104b; however, the number of the switches 104 may be one.

In the semiconductor device 100 illustrated in FIG. 6A, an on state or an off state of the switch 104 is selected according to the signal Sig. In the semiconductor device 100 illustrated in FIG. 6B, an on state or an off state of the switch 104a and the switch 104b is selected according to the signal Sig.

In one embodiment of the present invention, during a period in which the states of the p-channel transistor 120 and the n-channel transistor 122 are switched between an on state and an off state or a period in which the states of the p-channel transistor 121 and the n-channel transistor 123 are switched between an on state and an off state, the switch 104 in FIG. 6A and the switch 104a and the switch 104b in FIG. 6B are in an off state; thus, a current path between the wiring 105 and the wiring 106 through the logic circuit 101 is electrically interrupted. By the operation, shoot-through current is prevented from flowing between the wiring 105 and the wiring 106, and power consumption due to the shoot-through current can be prevented.

In one embodiment of the present invention, when the logic circuit 101 is in a standby mode, for example, the switch 104 in FIG. 6A and the switch 104a and the switch 104b in FIG. 6B are turned off, regardless of the potentials of the input signal IN1 and the input signal IN2. By the operation, the off-state currents of the p-channel transistor 120, the p-channel transistor 121, the n-channel transistor 122, and the n-channel transistor 123 are prevented from flowing between the wiring 105 and the wiring 106, and power consumption due to the off-state current can be prevented.

Next, the case where the semiconductor device 100 illustrated in FIG. 1A has NOR as the logic circuit 101 is given as an example, and a specific configuration of the semiconductor device 100 of one embodiment of the present invention will be described.

Figure 7A:
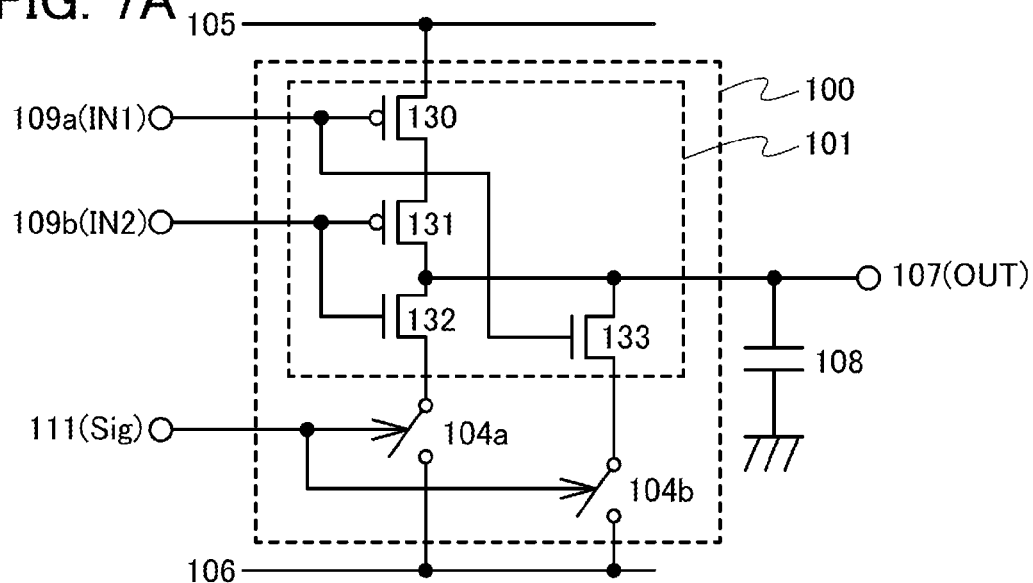
FIGS. 7A and 7B are diagrams each illustrating a structure and an operation of a semiconductor device including an NOR.

In a semiconductor device illustrated in FIG. 7A, the logic circuit 101 includes a p-channel transistor 130, a p-channel transistor 131, an n-channel transistor 132, and an n-channel transistor 133.

Specifically, one of a source and a drain of the p-channel transistor 130 is electrically connected to the wiring 105 to which the high-level potential VDD is applied. A gate of the p-channel transistor 130 and a gate of the n-channel transistor 133 are electrically connected to the wiring 109a to which the potential of the input signal IN1 is applied. The other of the source and the drain of the p-channel transistor 130 is connected to one of a source and a drain of the p-channel transistor 131. A gate of the p-channel transistor 131 and a gate of the n-channel transistor 132 are electrically connected to the wiring 109b to which the potential the input signal IN2 is applied. The other of the source and the drain of the p-channel transistor 131, One of a source and a drain of the n-channel transistor 132, and One of a source and a drain of the n-channel transistor 133 are electrically connected to the wiring 107 to which the output signal OUT is input. The wiring 107 to which the output signal OUT is input has capacitance such as parasitic capacitance, and such capacitance is shown as the capacitor 108 in FIG. 7A. The other of the source and the drain of the n-channel transistor 132 and the wiring 106 to which the low-level potential VSS is applied are electrically connected through the switch 104a. The other of the source and the drain of the n-channel transistor 133 and the wiring 106 to which the low-level potential VSS is applied are electrically connected through the switch 104b.

FIG. 7A shows an example in which an electrical connection between the wiring 106 and the logic circuit 101 is controlled by the switch 104a and the switch 104b; however, the number of the switches 104 may be one.

Next, the case where the semiconductor device 100 illustrated in FIG. 1B has NOR as the logic circuit 101 is given as an example, and a specific configuration of the semiconductor device 100 of one embodiment of the present invention will be described.

Figure 7B:
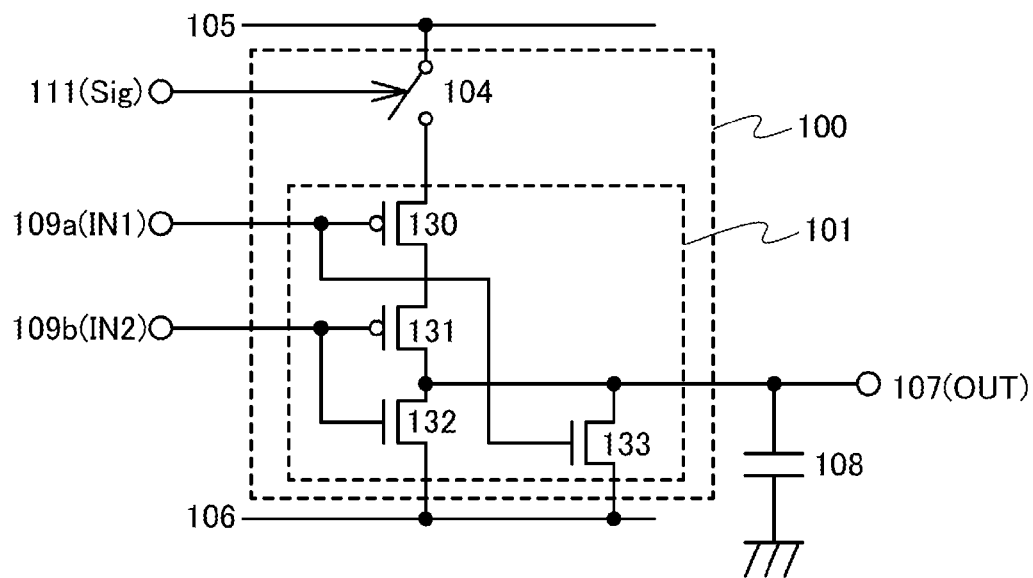

In the semiconductor device 100 illustrated in FIG. 7B, the logic circuit 101 includes the p-channel transistor 130, the p-channel transistor 131, the n-channel transistor 132, and the n-channel transistor 133, as in FIG. 7A.

Specifically, the one of the source and the drain of the p-channel transistor 130 and the wiring 105 to which the high-level potential VDD is applied are electrically connected through the switch 104. The gate of the p-channel transistor 130 and the gate of the n-channel transistor 133 are electrically connected to the wiring 109a to which the potential of the input signal IN1 is applied. The other of the source and the drain of the p-channel transistor 130 is connected to the one of the source and the drain of the p-channel transistor 131. The gate of the p-channel transistor 131 and the gate of the n-channel transistor 132 are electrically connected to the wiring 109b to which the potential of the input signal IN2 is applied. The other of the source and the drain of the p-channel transistor 131, the one of the source and the drain of the n-channel transistor 132, and the one of the source and the drain of the n-channel transistor 133 are electrically connected to the wiring 107 to which the output signal OUT is input. The wiring 107 to which the output signal OUT is input has capacitance such as parasitic capacitance, and such capacitance is referred to as the capacitor 108 in FIG. 7B. The other of the source and the drain of the n-channel transistor 132 and the wiring 106 to which the low-level potential VSS is applied are electrically connected. The other of the source and the drain of the n-channel transistor 133 and the wiring 106 to which the low-level potential VSS is applied are electrically connected.

In the semiconductor device 100 illustrated in FIG. 7A, an on state or an off state of the switch 104a and the switch 104b is selected according to the signal Sig. In the semiconductor device 100 illustrated in FIG. 7B, an on state or an off state of the switch 104 is selected according to the signal Sig.

In one embodiment of the present invention, during a period in which the states of the p-channel transistor 130 and the n-channel transistor 133 are switched between an on state and an off state or a period in which the states of the p-channel transistor 131 and the n-channel transistor 132 are switched between an on state and an off state, the switch 104a and the switch 104b in FIG. 7A and the switch 104 in FIG. 7B are in an off state; thus, a current path between the wiring 105 and the wiring 106 through the logic circuit 101 is electrically interrupted. By the operation, shoot-through current is prevented from flowing between the wiring 105 and the wiring 106, and power consumption due to the shoot-through current can be prevented.

In one embodiment of the present invention, when the logic circuit 101 is in a standby mode, for example, the switch 104a and the switch 104b in FIG. 7A and the switch 104 in FIG. 7B are turned off, regardless of the potentials of the input signal IN1 and the input signal IN2. By the operation, the off-state currents of the p-channel transistor 130, the p-channel transistor 131, the n-channel transistor 132, and the n-channel transistor 133 are prevented from flowing between the wiring 105 and the wiring 106, and power consumption due to the off-state current can be prevented.

Next, the case where the semiconductor device 100 illustrated in FIG. 1A has a flip-flop as the logic circuit 101 is given as an example, and a specific configuration of the semiconductor device 100 of one embodiment of the present invention will be described.

Figure 8A:
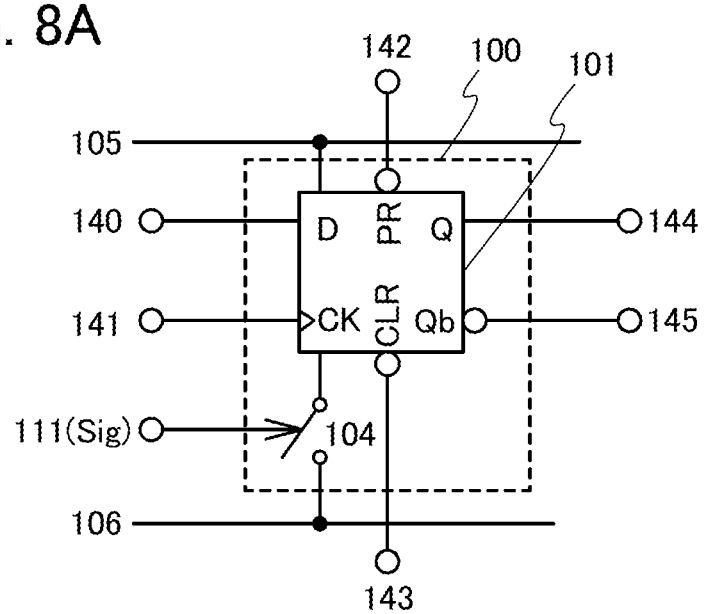
FIGS. 8A and 8B are diagrams illustrating a structure of a semiconductor device including a flip-flop.

In the semiconductor device 100 illustrated in FIG. 8A, the logic circuit 101 is a flip-flop, a signal D is input from a wiring 140, a clock signal CK is input from a wiring 141, a signal PR is input from a wiring 142, a signal CLR is input from a wiring 143, an output signal Q is output from a wiring 144, and an output signal Qb is output from a wiring 145.

Figure 8B:
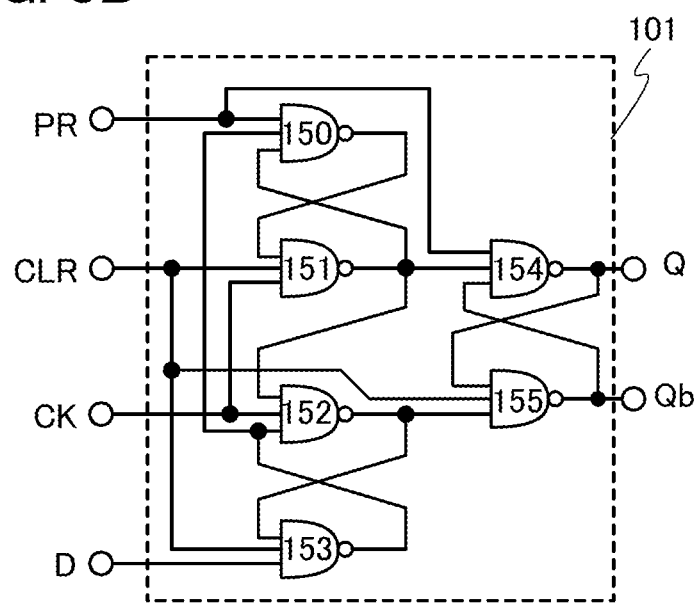

FIG. 8B shows one example of a specific structure of the logic circuit 101 illustrated in FIG. 8A. The logic circuit 101 illustrated in FIG. 8B has a NAND 150, a NAND 151, a NAND 152, a NAND 153, a NAND 154, and a NAND 155, each of which has three input terminals. The signal PR is input to a first input terminal of the NAND 150 and a first input terminal of the NAND 154. The signal CLR is input to a second input terminal of the NAND 151, a second input terminal of the NAND 155, and a second input terminal of the NAND 153. The clock signal CK is input to a third input terminal of the NAND 151 and a second input terminal of the NAND 152. The signal D is input to a third input terminal of the NAND 153.

An output terminal of the NAND 150 is electrically connected to a first input terminal of the NAND 151. An output terminal of the NAND 151 is electrically connected to a third input terminal of the NAND 150, a second input terminal of the NAND 154, and a first input terminal of the NAND 152. An output terminal of the NAND 152 is electrically connected to a third input terminal of the NAND 155, and a first input terminal of the NAND 153. An output terminal of the NAND 153 is electrically connected to a third input terminal of the NAND 152 and a second input terminal of the NAND 150. An output terminal of the NAND 154 is electrically connected to a first input terminal of the NAND 155, and the potential of the output terminal of the NAND 154 is output as the output signal Q from the logic circuit 101. An output terminal of the NAND 155 is electrically connected to a third input terminal of the NAND 154, and the potential of the output terminal of the NAND 155 is output as the output signal Qb from the logic circuit 101.

Note that as illustrated in FIG. 8A, the logic circuit 101 is electrically connected to the wiring 105 to which the potential VDD is applied. Specifically, the NAND 150 to the NAND 155 included in the logic circuit 101 are each electrically connected to the wiring 105. As illustrated in FIG. 8A, the logic circuit 101 and the wiring 106 to which the potential VSS is applied are electrically connected through the switch 104. Specifically, the NAND 150 to the NAND 155 included in the logic circuit 101 are each electrically connected to the wiring 106 through the switch 104.

FIG. 8A shows the case where the logic circuit 101 and the wiring 106 are electrically connected through the switch 104, as an example. However, in the semiconductor device 100 of one embodiment of the present invention, each of the NAND 150 to the NAND 155 may be electrically connected to the wiring 106 through a plurality of switches 104.

In one embodiment of the present invention, during a period in which the states of the p-channel transistor and the n-channel transistor included in the NAND 150 to the NAND 155 are switched between an on state and an off state in accordance with the signal D, the clock signal CK, the signal PR, and the signal CLR, each of which corresponds to the input signal IN, the switch 104 is in an off state; thus, a current path between the wiring 105 and the wiring 106 through the logic circuit 101 is electrically interrupted. By the operation, shoot-through current is prevented from flowing between the wiring 105 and the wiring 106, and power consumption due to the shoot-through current can be prevented.

In one embodiment of the present invention, when the logic circuit 101 is in a standby mode, for example, the switch 104 is turned off, regardless of the potentials of the signal D, the clock signal CK, the signal PR, and the signal CLR each of which corresponds to the input signal IN. By the operation, the off-state currents of the p-channel transistors and the n-channel transistors which are included in the NAND 150 to the NAND 155 are prevented from flowing between the wiring 105 and the wiring 106, and power consumption due to the off-state current can be prevented.

Note that a flip-flop capable of employing the structure of one embodiment of the present invention is not limited to the above structure and may have any structure as long as the flip-flop is a complementary circuit which can hold one bit data by feedback.

FIGS. 8A and 8B show the case where the switch 104 controls an electrical connection between the logic circuit 101 and the wiring 106, for example. However, in one embodiment of the present invention, the switch 104 may control an electrical connection between the logic circuit 101 and the wiring 105 in FIGS. 8A and 8B.

Figure 9:
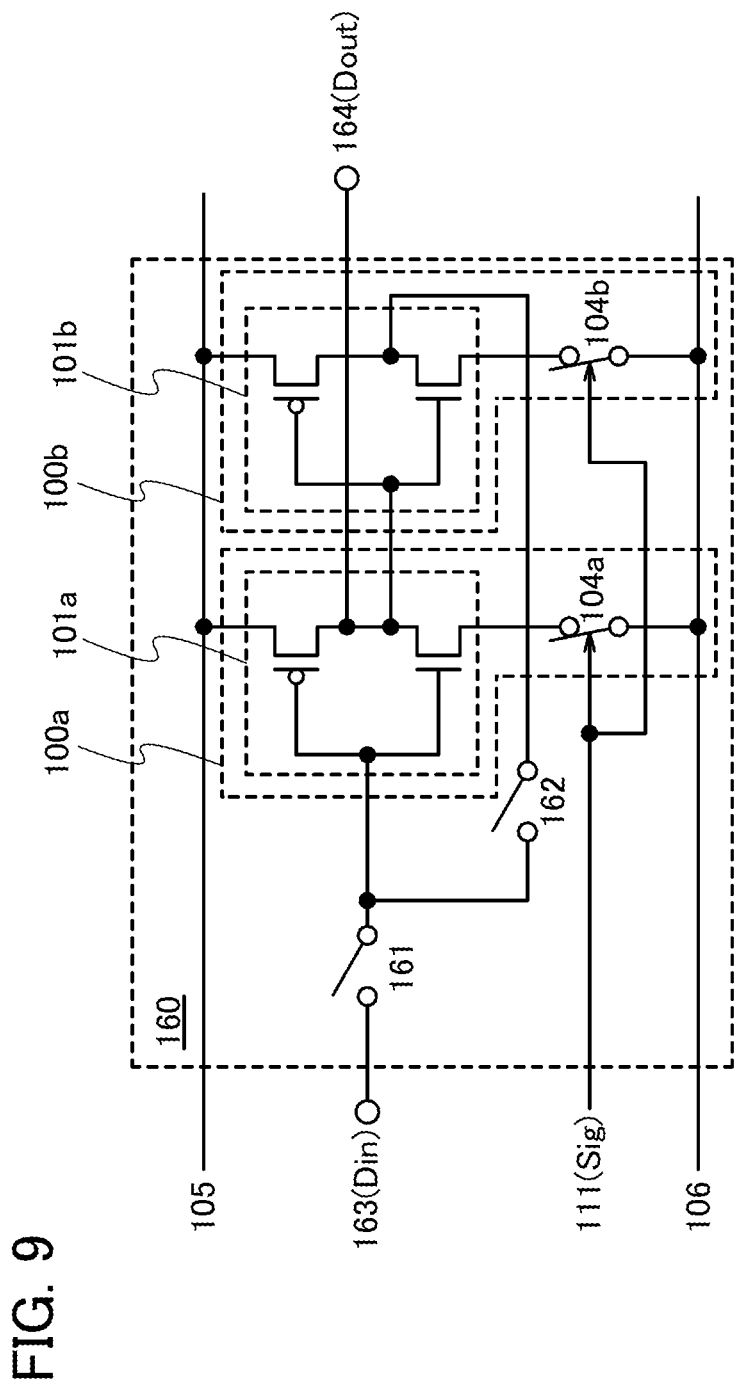
FIG. 9 is a diagram illustrating a register.

Next, FIG. 9 illustrates a structure of a register using the semiconductor device 100 illustrated in FIG. 1A, as an example. Note that FIG. 9 illustrates a semiconductor device 100a and a semiconductor device 100b as examples of the semiconductor device 100 in FIG. 1A which is electrically connected to the wiring 109 and the wiring 110.

A register 160 illustrated in FIG. 9 includes the semiconductor device 100a, the semiconductor device 100b, a switch 161, and the switch 162. The switch 161 controls an input of an input signal Din, which is input through a wiring 163, to the semiconductor device 100a. The input signal Din is input to a logic circuit 101a of the semiconductor device 100a as the input signal IN, and the output signal OUT output from the logic circuit 101a is input to the logic circuit 101b of the semiconductor device 100b as the input signal IN. In addition, the output signal OUT output from the logic circuit 101b is input to the logic circuit 101a of the semiconductor device 100a through the switch 162 as the input signal IN. The output signal OUT output from the logic circuit 101a of the semiconductor device 100a is input to a wiring 164 as an output signal Dout of the register 160.

The input signal Din which is input to the register 160 by turning on the switch 161 is held in the register 160 when the switch 161 is turned off and the switch 162 is turned on.

In one embodiment of the present invention, during a period in which the level of the potential of the input signal Din which is input to the register 160 when the switch 161 is in an on state changes, the switch 104a is in an off state to electrically interrupt a current path between the wiring 105 and the wiring 106 through the logic circuit 101a or the switch 104b is in an off state to electrically interrupt a current path between the wiring 105 and the wiring 106 through the logic circuit 101b. By the operation, shoot-through current is prevented from flowing between the wiring 105 and the wiring 106, and power consumption due to the shoot-through current can be prevented.

In one embodiment of the present invention, when the logic circuit 101 is in a standby mode, for example, the switch 104a and the switch 104b are turned off. By the operation, the off-state currents of the transistors in the logic circuit 101a or the logic circuit 101b are prevented from flowing between the wiring 105 and the wiring 106, and power consumption due to the off-state current can be prevented.

FIG. 9 shows the case where the switch 104a and the switch 104b control an electrical connection between the logic circuit 101a and the wiring 106 and an electrical connection between the logic circuit 101b and the wiring 106, respectively, for example. However, in one embodiment of the present invention, the switch 104a may control an electrical connection between the logic circuit 101a and the wiring 105 or the switch 104b may control an electrical connection between the logic circuit 101b and the wiring 105 in FIG. 9.

Figure 10:
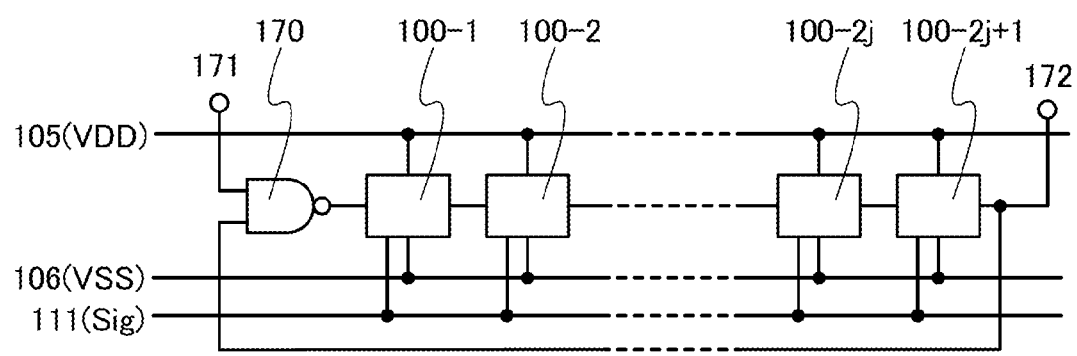
FIG. 10 is a diagram illustrating a ring oscillator.

Next, FIG. 10 illustrates a structure of a ring oscillator including a plurality of the semiconductor devices 100 illustrated in FIG. 3, as an example.

A ring oscillator illustrated in FIG. 10 includes $2j+1$ semiconductor devices 100 illustrated in FIG. 3 (j is a natural number) and a NAND 170. The $2j+1$ semiconductor devices 100 are connected so that the output signal OUT of the semiconductor device 100 in a stage is input as the input signal IN to the semiconductor device 100 in the next stage. Note that to the semiconductor device 100-1 in the first stage, an output signal from the NAND 170 is input as the input signal IN. In addition, the output signal OUT of the semiconductor device 100-$2j+1$ in the last stage is input to the NAND 170. To the NAND 170, a signal is also input from the outside of the ring oscillator through a wiring 171. The output signal OUT of the semiconductor device 100-$2j+1$ in the last stage is applied to the wiring 172 as an output signal of the ring oscillator.

The ring oscillator which uses a structure of one embodiment of the present invention has low power consumption because in the ring oscillator, shoot-through current and off-state current can be prevented from flowing through a logic circuit in each semiconductor device 100.

Embodiment 2

Figure 11:
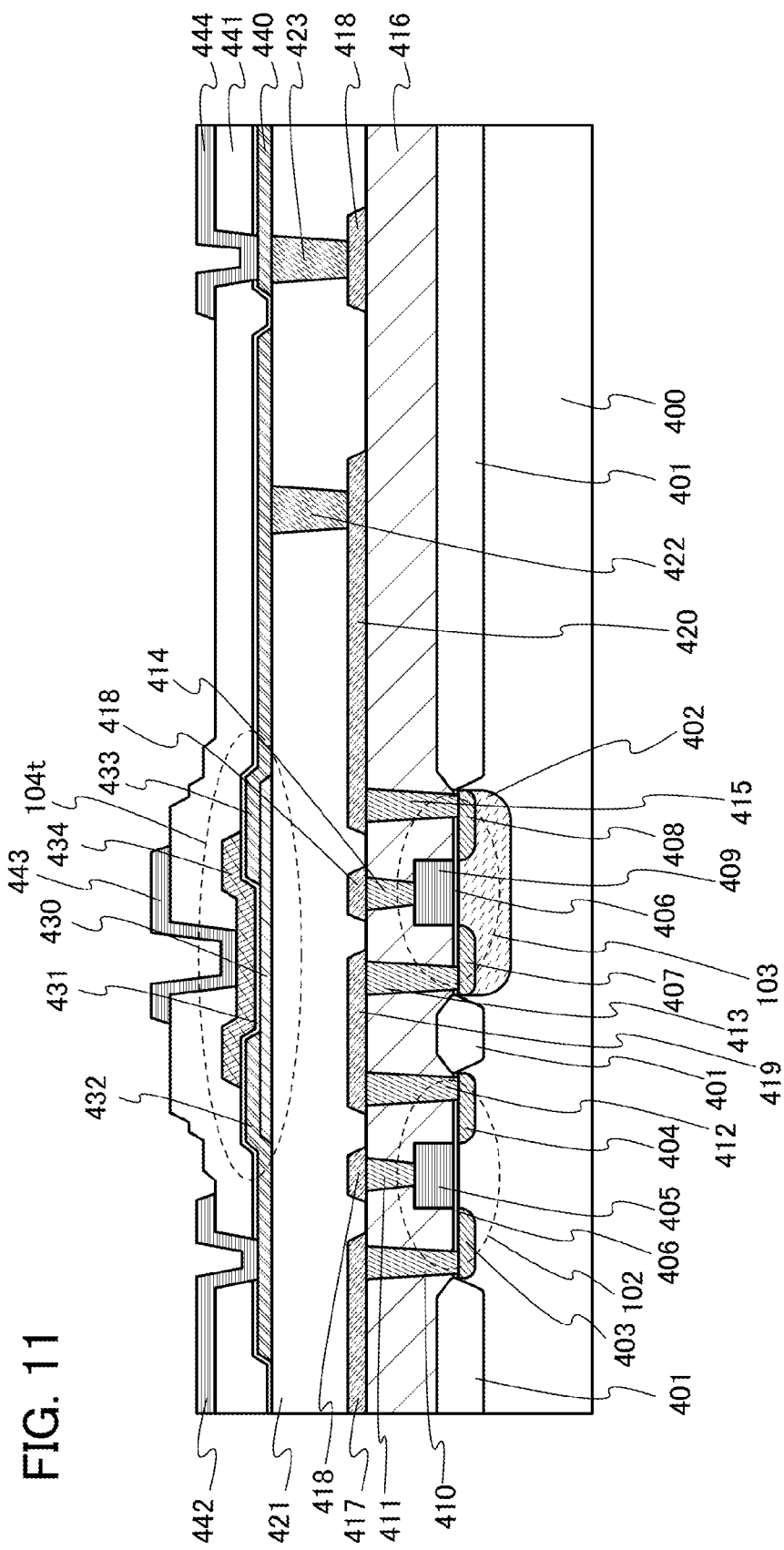
FIG. 11 is a cross-sectional view of a semiconductor device.

FIG. 11 illustrates part of a cross sectional structure of a semiconductor device of one embodiment of the present invention, as an example. FIG. 11 illustrates the transistor 104t, the p-channel transistor 102, and the n-channel transistor 103 of the semiconductor device 100 illustrated in FIG. 3.

In this embodiment, described is the case where the p-channel transistor 102 and the n-channel transistor 103 are formed in a single crystal silicon substrate and the transistor 104t using an oxide semiconductor film is formed over the p-channel transistor 102 and the n-channel transistor 103. The p-channel transistor 102 and the n-channel transistor 103 may each include a semiconductor thin film of silicon, germanium, or the like in an amorphous, microcrystalline, polycrystalline, or signal crystal state. Alternatively, the p-channel transistor 102 and the n-channel transistor 103 may include an oxide semiconductor film. In the case where the transistors each include an oxide semiconductor, the transistor 104t is not necessarily stacked above the p-channel transistor 102 and the n-channel transistor 103, and the transistor 104t, the p-channel transistor 102, and the n-channel transistor 103 may be formed over the same insulating surface.

In the case where the p-channel transistor 102 and the n-channel transistor 103 may each be formed using a thin silicon film, any of the following can be used: amorphous silicon formed by sputtering or vapor phase growth such as plasma-enhanced CVD; polycrystalline silicon obtained by crystallization of amorphous silicon by treatment such as laser annealing; single crystal silicon obtained by separation of a surface portion of a single crystal silicon wafer by implantation of hydrogen ions or the like into the silicon wafer; and the like.

In FIG. 11, the p-channel transistor 102 and the n-channel transistor 103 are formed in a semiconductor substrate 400.

The semiconductor substrate 400 can be, for example, a single crystal silicon substrate having n-type or p-type conductivity, or a compound semiconductor substrate (e.g., a GaAs substrate, an InP substrate, a GaN substrate, a SiC substrate, or a ZnSe substrate). FIG. 11 illustrates an example in which a single crystal silicon substrate having n-type conductivity is used.

The p-channel transistor 102 and the n-channel transistor 103 are electrically isolated by an element isolation insulating film 401. The element isolation insulating film 401 can be formed by a local oxidation of silicon (LOCOS) method, a trench isolation method, or the like.

In a region where the n-channel transistor 103 is formed, a p-well 402 is formed by selective introduction of an impurity element imparting p-type conductivity.

Specifically, the p-channel transistor 102 includes the semiconductor substrate 400, impurity regions 403 and 404 which are formed in the semiconductor substrate 400 and function as source and drain regions, a gate electrode 405, and a gate insulating film 406 sandwiched between the semiconductor substrate 400 and the gate electrode 405. The gate electrode 405 overlaps with a channel formation region formed between the impurity regions 403 and 404, with the gate insulating film 406 laid therebetween.

Specifically, the n-channel transistor 103 includes the semiconductor substrate 400, impurity regions 407 and 408 that are formed in the semiconductor substrate 400 and function as a source region and a drain region, the gate electrode 409, and the gate insulating film 406 provided between the semiconductor substrate 400 and the gate electrode 409. The gate electrode 409 overlaps with a channel formation region formed between the impurity regions 407 and 408 with the gate insulating film 406 laid between the gate electrode 409 and the channel formation region.

An insulating film 416 is formed over the p-channel transistor 102 and the n-channel transistor 103. Openings are formed to penetrate the insulating film 416, and a wiring 410, a wiring 411, a wiring 412, a wiring 413, a wiring 414, and a wiring 415 are formed in the openings to be in contact with the impurity region 403, the gate electrode 405, the impurity region 404, the impurity region 407, the gate electrode 409, and the impurity region 408, respectively.

The wiring 410 is connected to a wiring 417 formed over the insulating film 416. The wiring 411 and the wiring 414 are connected to a wiring 418 formed over the insulating film 416. The wiring 412 and the wiring 413 are connected to a wiring 419 formed over the insulating film 416. The wiring 415 is connected to a wiring 420 formed over the insulating film 416.

An insulating film 421 is formed over the wirings 417 to 420. Openings are formed to penetrate the insulating film 421, and a wiring 422 and a wiring 423 which are connected to the wiring 420 and the wiring 418, respectively, are formed in the openings.

In FIG. 11, the transistor 104t is formed over the insulating film 421.

The transistor 104t includes, over the insulating film 421, a semiconductor film 430 containing an oxide semiconductor, conductive films 432 and 433 that are positioned over the semiconductor film 430 and function as a source electrode and a drain electrode, a gate insulating film 431 over the semiconductor film 430 and the conductive films 432 and 433, and a gate electrode 434 that overlaps with the semiconductor film 430 between the conductive films 432 and 433 with the gate insulating film 431 positioned between the gate electrode 434 and the semiconductor film 430.

The conductive film 433 is in contact with the wiring 422.

A conductive film 440 is provided over the insulating film 421 and is connected to the wiring 423.

An insulating film 441 is provided over the transistor 104t and the conductive film 440. Openings are formed in the insulating film 441 and the gate insulating film 431. A conductive film 442, a conductive film 443, and a conductive film 444 are provided over the insulating film 441. In the openings, the conductive film 442 is in contact with the conductive film 432, the conductive film 443 is in contact with the gate electrode 434, and the conductive film 444 is in contact with the conductive film 440.

In FIG. 11, the transistor 104t includes the gate electrode 434 on at least one side of the semiconductor film 430. Alternatively, the transistor 104t may include a pair of gate electrodes provided with the semiconductor film 430 laid therebetween.

An oxide semiconductor to be used for the semiconductor film 430 preferably contains at least indium (In) or zinc (Zn). As a stabilizer for reducing variation in electric characteristics of a transistor including the oxide semiconductor, gallium (Ga) is preferably additionally included. Tin (Sn) is preferably contained as a stabilizer.

Hafnium (Hf) is preferably contained as a stabilizer. Aluminum (Al) is preferably contained as a stabilizer. Zirconium (Zr) is preferably contained as a stabilizer.

In—Ga—Zn-based oxide and In—Sn—Zn-based oxide among oxide semiconductors have the following advantages over silicon carbide, gallium nitride, and gallium oxide: transistors with excellent electrical characteristics can be formed by sputtering or a wet process and thus can be mass-produced easily. Further, unlike silicon carbide, gallium nitride, or gallium oxide, with the use of the In—Ga—Zn-based oxide, a transistor with favorable electrical characteristics can be formed over a glass substrate. Further, a larger substrate can be used.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, any of the following oxides can be used, for example: indium oxide, gallium oxide, tin oxide, zinc oxide, In—Zn-based oxide, Sn—Zn-based oxide, Al—Zn-based oxide, Zn—Mg-based oxide, Sn—Mg-based oxide, In—Mg-based oxide, In—Ga-based oxide, In—Ga—Zn-based oxide (also referred to as IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and In—Hf—Al—Zn-based oxide.

For example, an In—Ga—Zn-based oxide refers to an oxide containing In, Ga, and Zn, and there is no limitation on the composition ratio of In, Ga, and Zn. Further, the In—Ga—Zn-based oxide may contain a metal element other than In, Ga, and Zn. The In—Ga—Zn-based oxide has sufficiently high resistance when no electric field is applied thereto, so that off-state current can be sufficiently reduced. Further, the In—Ga—Zn-based oxide has high mobility.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide with an atomic ratio close to the above atomic ratios can be used. Alternatively, an In'Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide with an atomic ratio close to the above atomic ratios may be used.

For example, with an In—Sn—Zn-based oxide, high mobility can be realized relatively easily. However, even with an In—Ga—Zn-based oxide, mobility can be increased by reducing the defect density in the bulk.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of each crystal part fits inside a cube whose one side is less than 100 nm. Thus, there is a case where a crystal part included in the CAAC-OS film fits a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

In this specification, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor including the CAAC-OS film, a change in electrical characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol % or higher, preferably 100 vol %.

As an example of the sputtering target, an In—Ga—Zn-based oxide target is described below.

The In—Ga—Zn-based oxide target is polycrystalline and is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

The semiconductor film 430 may be a stack of a plurality of oxide semiconductor films formed using metal oxide targets with different atomic ratios of metals. For example, the semiconductor stack may be formed in such a manner that a first oxide semiconductor film is formed using a target with an atomic ratio of In:Ga:Zn of 1:1:1 and a second oxide semiconductor film is formed using a target with an atomic ratio of In:Ga:Zn of 3:1:2. Alternatively, the semiconductor stack may be formed in such a manner that a first oxide semiconductor film, a second oxide semiconductor film, and a third oxide semiconductor film are formed with targets having atomic ratios of In:Ga:Zn of 1:3:2, 3:1:2, and 1:1:1, respectively.

Alternatively, the semiconductor film 430 may be a stack of a plurality of oxide semiconductor films formed using metal oxide targets containing different metals.

This embodiment can be combined with any of the other embodiments as appropriate.

Embodiment 3

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other than the above, as an electronic appliance which can use the semiconductor device of one embodiment of the present invention, mobile phones, game machines including portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. FIGS. 12A to 12E illustrate specific examples of these electronic devices.

Figure 12A:
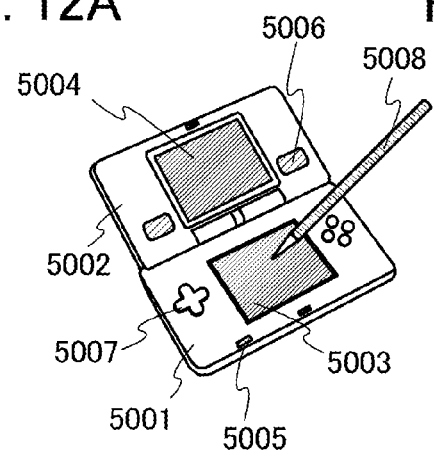
FIGS. 12A to 12E are diagrams of electronic devices.

FIG. 12A illustrates a portable game machine including a housing 5001, a housing 5002, a display portion 5003, a display portion 5004, a microphone 5005, speakers 5006, operation keys 5007, a stylus 5008, and the like. The semiconductor device of one embodiment of the present invention can be used for the display portion 5003, the display portion 5004, or another circuit. Although the portable game machine in FIG. 12A has the two display portions 5003 and 5004, the number of display portions included in a portable game machine is not limited to this.

Figure 12B:
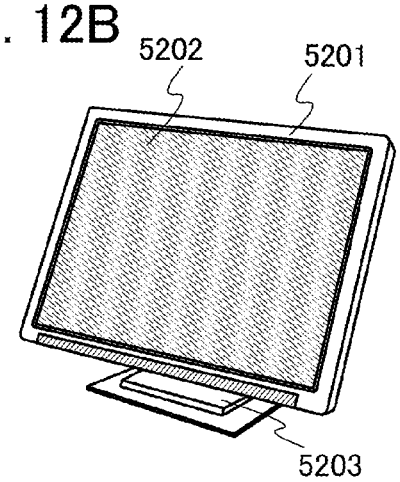

FIG. 12B illustrates a display device including a housing 5201, a display portion 5202, a support base 5203, and the like. The semiconductor device of one embodiment of the present invention can be used for the display portion 5202 or another circuit. Note that a display device includes, in its category, any display device for displaying information, such as display devices for personal computers, TV broadcast reception, and advertisement.

Figure 12C:
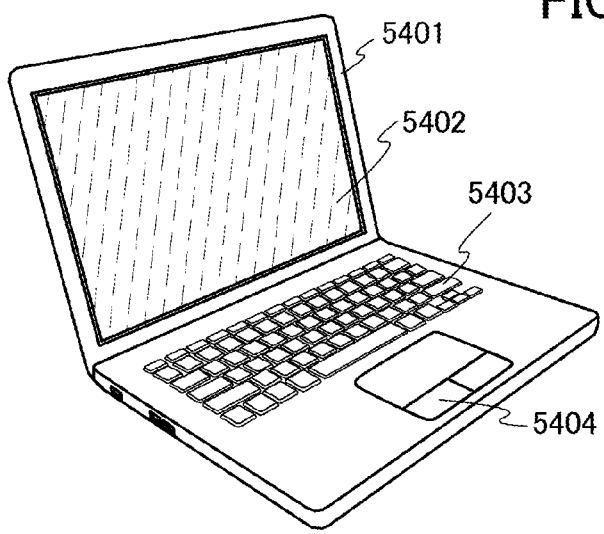

FIG. 12C illustrates a laptop personal computer including a housing 5401, a display portion 5402, a keyboard 5403, a pointing device 5404, and the like. The semiconductor device of one embodiment of the present invention can be used for the display portion 5402 or another circuit.

Figure 12D:
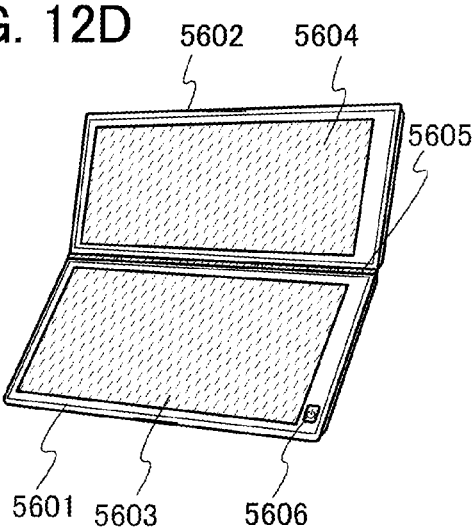

FIG. 12D illustrates a portable information terminal including a first housing 5601, a second housing 5602, a first display portion 5603, a second display portion 5604, a joint 5605, an operation key 5606, and the like. The first display portion 5603 is provided in the first housing 5601, and the second display portion 5604 is provided in the second housing 5602. The first housing 5601 and the second housing 5602 are connected to each other with the joint 5605, and an angle between the first housing 5601 and the second housing 5602 can be changed with the joint 5605. Images on the first display portion 5603 may be switched in accordance with the angle at the joint 5605 between the first housing 5601 and the second housing 5602. The semiconductor device of one embodiment of the present invention can be used for the first display portion 5603, the second display portion 5604, or another circuit. A semiconductor device with a position input function may be used as at least one of the first display portion 5603 and the second display portion 5604. Note that the position input function can be added by providing a touch panel in a semiconductor device. Alternatively, the position input function can be added by provision of a photoelectric conversion element called a photosensor in a pixel area of a semiconductor device.

Figure 12E:
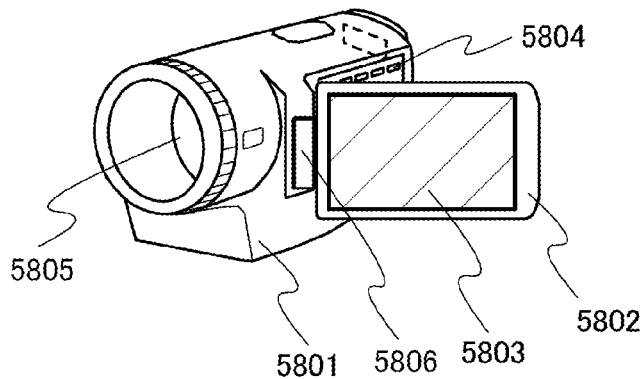

FIG. 12E illustrates a video camera including a first housing 5801, a second housing 5802, a display portion 5803, operation keys 5804, a lens 5805, a joint 5806, and the like. The operation keys 5804 and the lens 5805 are provided for the first housing 5801, and the display portion 5803 is provided for the second housing 5802. The first housing 5801 is connected to the second housing 5802 by the joint 5806, and the angle between the first housing 5801 and the second housing 5802 can be changed by the joint 5806. Images on the display portion 5803 may be switched in accordance with the angle at the joint 5806 between the first housing 5801 and the second housing 5802. The semiconductor device of one embodiment of the present invention can be used for the display portion 5803 or another circuit.

This embodiment can be combined with any of the other embodiments as appropriate.

This application is based on Japanese Patent Application serial no. 2012-177881 filed with Japan Patent Office on Aug. 10, 2012, the entire contents of which are hereby incorporated by reference.

What is claimed is:

1. A method for driving a semiconductor device comprising a first wiring, a second wiring, a first transistor, a second transistor whose conductivity type is different from a conductivity type of the first transistor, and a third transistor having a channel formation region including a semiconductor, a band gap of which is higher than a band gap of silicon and an intrinsic carrier density of which is lower than an intrinsic carrier density of silicon,
   wherein one of a source and a drain of the first transistor is electrically connected to the first wiring, and the other of the source and the drain of the first transistor is electrically connected to one of a source and a drain of the second transistor, and
   wherein one of a source and a drain of the third transistor is electrically connected to the other of the source and the drain of the second transistor, and the other of the source and the drain of the third transistor is electrically connected to the second wiring, the method comprising:
      in a first period, turning off the third transistor when the first transistor is switched from one of an on state and an off state to the other of the on state and the off state, and turning on the third transistor when one of the first transistor and the second transistor is turned on and the other of the first transistor and the second transistor is turned off; and
      in a second period after the first period, turning off the third transistor regardless of a state of the second transistor.

2. The method according to claim 1,
   wherein in the first period, the third transistor is in an off state while the first transistor is switched from the one of the on state and the off state to the other of the on state and the off state, and
   wherein in the first period, the third transistor is in an on state while one of the first transistor and the second transistor is in an on state and the other of the first transistor and the second transistor is in an off state.

3. The method according to claim 1, wherein in the first period, the third transistor is in an off state while the second transistor is in an off state.

4. The method according to claim 1, wherein in the second period, the third transistor is in an off state both while the second transistor is in an on state and while the second transistor is in an off state.

5. The method according to claim 1, wherein the semiconductor is an oxide semiconductor.

6. The method according to claim 5, wherein the oxide semiconductor includes indium, gallium, and zinc.

7. The method according to claim 1,
   wherein the first transistor is one of a p-channel transistor and a n-channel transistor, and
   wherein the second transistor is the other of the p-channel transistor and the n-channel transistor.

8. The method according to claim 1, wherein a gate of the first transistor is electrically connected to a gate of the second transistor.

9. The method according to claim 1, wherein the second period is a period in a standby mode.

10. The method according to claim 1, wherein the first transistor or the second transistor has a channel formation region including a polycrystalline silicon or single crystal silicon.

11. A method for driving a semiconductor device comprising a first wiring, a second wiring, a first transistor, a second transistor whose conductivity type is different from a conductivity type of the first transistor, and a third transistor having a channel formation region including a semiconductor, a band gap of which is higher than a band gap of silicon and an intrinsic carrier density of which is lower than an intrinsic carrier density of silicon,
wherein one of a source and a drain of the first transistor is electrically connected to the first wiring, and the other of the source and the drain of the first transistor is electrically connected to one of a source and a drain of the third transistor, and
wherein one of a source and a drain of the second transistor is electrically connected to the other of the source and the drain of the third transistor, and the other of the source and the drain of the second transistor is electrically connected to the second wiring, the method comprising:
in a first period, turning off the third transistor when the first transistor is switched from one of an on state and an off state to the other of the on state and the off state, and turning on the third transistor when one of the first transistor and the second transistor is turned on and the other of the first transistor and the second transistor is turned off; and,
in a second period after the first period, turning off the third transistor regardless of a state of the second transistor.

12. The method according to claim 11,
wherein in the first period, the third transistor is in an off state while the first transistor is switched from the one of the on state and the off state to the other of the on state and the off state, and
wherein in the first period, the third transistor is in an on state while one of the first transistor and the second transistor is in an on state and the other of the first transistor and the second transistor is in an off state.

13. The method according to claim 11, wherein in the first period, the third transistor is in an off state while the second transistor is in an off state.

14. The method according to claim 11, wherein in the second period, the third transistor is in an off state both while the second transistor is in an on state and while the second transistor is in an off state.

15. The method according to claim 11, wherein the semiconductor is an oxide semiconductor.

16. The method according to claim 15, wherein the oxide semiconductor includes indium, gallium, and zinc.

17. The method according to claim 11,
wherein the first transistor is one of a p-channel transistor and a n-channel transistor, and
wherein the second transistor is the other of the p-channel transistor and the n-channel transistor.

18. The method according to claim 11, wherein a gate of the first transistor is electrically connected to a gate of the second transistor.

19. The method according to claim 11, wherein the second period is a period in a standby mode.

20. The method according to claim 11, wherein the first transistor or the second transistor has a channel formation region including a polycrystalline silicon or single crystal silicon.

* * * * *